(12) United States Patent
Hshieh

(10) Patent No.: US 7,960,787 B2
(45) Date of Patent: Jun. 14, 2011

(54) CONFIGURATION OF TRENCHED SEMICONDUCTOR POWER DEVICE TO REDUCE MASKED PROCESS

(75) Inventor: Fwa-Iuan Hshieh, Saratoga, CA (US)

(73) Assignee: Force-MOS Technology Corporation, British West Indies ( * ) Notice: Subject to any disclaimer, the term of this patent is extended or adjusted under 35 U.S.C. 154(b) by 244 days.

(21) Appl. No.: 12/291,365

(22) Filed: Nov. 7, 2008

(65) Prior Publication Data
US 2010/0117145 A1   May 13, 2010

(51) Int. Cl.
*H01L 29/78* (2006.01)
(52) U.S. Cl. .................... 257/341; 257/E29.028
(58) Field of Classification Search .......... 257/328, 257/329, 330, 341, 401, E29.027, E29.028
See application file for complete search history.

(56) References Cited

U.S. PATENT DOCUMENTS
2005/0215011 A1* 9/2005 Darwish et al. ............ 438/270
* cited by examiner

*Primary Examiner* — Thomas L Dickey
(74) *Attorney, Agent, or Firm* — Bo-In Lin

(57) ABSTRACT

A semiconductor power device formed on a semiconductor substrate of a first conductivity type wherein the semiconductor power device includes trench gates surrounded by body regions of a second conductivity type encompassing source regions of the first conductivity type therein. The semiconductor power device further includes trench contact structure having a plurality of trench contacts with trenches extended into the body regions for as source-body contacts and extended into the trench gates as gate contact. The semiconductor power device further includes a termination area wherein a plurality of the trench gate contacts are electrically connected to the source-body contacts.

10 Claims, 8 Drawing Sheets

CONFIGURATION OF TRENCHED SEMICONDUCTOR POWER DEVICE TO REDUCE MASKED PROCESS

BACKGROUND OF THE INVENTION

1. Field of the Invention

This invention relates generally to the cell structure, device configuration and fabrication process of power semiconductor devices. More particularly, this invention relates to a novel manufacturing processes with reduced masks by implementing improved termination configuration with trench contacts for both gate and source-body regions and multiple trench gates that are connected to the source-body regions in the termination areas thus preventing leakage currents.

2. Description of the Related Art

Conventional technologies for manufacturing semiconductor power devices are continuously challenged to further reduce the manufacturing cost by reducing the number of masks applied in the manufacturing processes. Furthermore, in attempt to miniaturize the device, the technologies are still faced with a limitation that prevents further increase of the cell density on a limited wafer surface area. Particularly, the limitations are caused by the wafer areas occupied by planar contacts and device configuration that may induce leakage currents thus leading to a breakdown voltage reduction.

Specifically, Wahl, et al. disclose in U.S. Pat. No. 6,462,376 a power MOSFET device that includes trenching floating rings with N+ source on top of the termination area as shown in FIG. 1A. The disclosures made in U.S. Pat. No. 6,462,376 are hereby incorporated by reference and FIG. 1A as included in this section is the same as FIG. 6 of U.S. Pat. No. 6,462,376. The potential of the trench gate that function as the floating rings may be higher than the source body region to induce a leakage current from the drain to the source because of the channel region is inverted to N type dopant. The leakage current thus leads to a lower breakdown voltage of the device. Darwish et al. discloses in U.S. Pat. No. 7,045,857 a trench device that includes trench gates in termination connected to the P-body region. However, as shown in FIG. 1B, the structures have planar contacts and such contacts are not suitable for device shrinkage with the planar contact occupies larger areas. Furthermore, the manufacturing processes of the device are much more complicate and applying more than four masks. The production cost is therefore increased when a device is configured according to the disclosures made by Darwish. Again, the disclosures made by Darwish in U.S. Pat. No. 7,045,857 are hereby incorporated by references and FIG. 1B as included in this section is the same as FIG. 29 of U.S. Pat. No. 7,045,857.

Therefore, there is still a need in the art of the semiconductor device fabrication, particularly for trenched power MOSFET design and fabrication, particularly in the termination area, to provide a novel cell structure, device configuration and fabrication process that would resolve these difficulties and design limitations. Specifically, it is desirable to maintain good electric contact to of trenched gate to the source body regions in the termination area to prevent a leakage current. Furthermore, it is very desirable to reduce the number of masks employed to manufacture the semiconductor power devices such that the above discussed difficulties and limitations may be resolved.

SUMMARY OF THE PRESENT INVENTION

It is therefore an aspect of the present invention to provide new and improved semiconductor power device configuration with reduced termination areas by using trench contact structures for both gate and source body contact and further with multiple trench gate connected with source body in the termination. The limitation of the prior art disclosures using the planar contacts in the termination areas is therefore resolved.

It is another aspect of this invention to further simplify the manufacturing processes by saving both the body mask and the source mask. The further simplified manufacture processes thus achieve product cost savings and further improve the production yield, the device reliability and performance.

It is another aspect of this invention that the electrical contacts to the source; the gate; the gate-runner is all implemented with a tungsten contact plug disposed in the contact trenches. A Ti or TiN high conductivity layer is also formed to provide greater contact areas to the source metal and gate pads thus reducing the contact resistance. The electrical contacts are further improved with the contact plug directly contact those regions by extending into the source-body regions, the gate polysilicon, and the body doped region under the source-body contact trenches, thus reliable and high performance electrical contacts are provided.

It is another aspect of this invention that the leakage currents are eliminated since the trench gate contact plugs are electrically connected to to the source body region in the termination areas. The problems of breakdown voltage reduction due to leakage currents in the termination areas are therefore resolved.

Briefly, in a preferred embodiment, the present invention discloses a semiconductor power device formed on a semiconductor substrate of a first conductivity type wherein the semiconductor power device includes trench gates surrounded by body regions of a second conductivity type encompassing source regions of the first conductivity type therein. The semiconductor power device further includes trench contact structure having a plurality of trench contacts with trenches extended into the body regions for as source-body contacts and extended into the trench gates as gate contact. The semiconductor power device further includes a termination area wherein a plurality of the trench gate contacts are electrically connected to the source-body contacts. In an exemplary embodiment, the semiconductor power device further includes an active cell areas and a plurality of gate runners as extension of the trench gates in the active cell areas not connected to the trench gates in the termination area. In another exemplary embodiment, the semiconductor power device is a metal oxide semiconductor field effect transistor (MOSFET) device. In another exemplary the semiconductor is a N-channel MOSFET device supported on a N-type semiconductor substrate. In another exemplary embodiment, the semiconductor power device is a P-channel MOSFET device supported on a P-type semiconductor substrate. In another exemplary embodiment, the semiconductor power device further includes a insulation layer covering a top surface of the semiconductor substrate with the plurality of trench contacts opened therethrough and each of the trench contacts is filled with a contact plug. In another exemplary embodiment, the semiconductor power device further includes a insulation layer covering a top surface of the semiconductor substrate with the plurality of trench contacts opened therethrough and each of the trench contacts is filled with a contact plug composed of Ti/TiN as a barrier layer surrounding a tungsten plug. In another exemplary embodiment, the semiconductor power device further includes a insulation layer covering a top surface of the semiconductor substrate with the plurality of trench contacts opened therethrough wherein each of the source-body trench contacts having a contact dopant region disposed below the source-body trench contacts. In another exemplary embodiment, the semiconductor power device having the body regions and the source regions extended between areas between the trench gates whereby said body regions and source regions are formed without requiring a mask. In another exemplary embodiment, the semiconductor power device further includes a metal contact layer in electrical contact with said source-body contacts and also in electrical contact with the trench gate contacts for electrically connecting the trench source-body contacts to the trench gate contacts in the termination area. In another exemplary embodiment, the metal contact layer further comprises an aluminum layer.

This invention further discloses a method for manufacturing a trenched semiconductor power device. The method includes a step of forming a trench contact structure at a termination area by carrying out a step of applying a mask for opening plurality of trenches through an insulation layer covering a top surface of a semiconductor substrate wherein the trenches extend to source and body regions in the semiconductor substrate and also extended to trench gates provided to connect a plurality of trench gates to the source and body regions. In an exemplary embodiment, the method further includes a step of implanting through the plurality of trenches a contact dopant region below the source-body trench contacts. In another exemplary embodiment, the method further includes a step of filling the plurality of trenches with a contact plug composed of Ti/TiN as a barrier layer surrounding a tungsten plug. In another exemplary embodiment, the method further includes a step of forming the body regions and the source regions with a blank ion implant with the body regions and source regions extending between regions in the semiconductor substrate between the trench gates whereby the body regions and source regions are formed without requiring a mask. In another exemplary embodiment, the method further includes a step of forming a metal contact layer in electrical contact with the source-body contacts and also in electrical contact with the trench gate contacts for electrically connecting the trench source-body contacts to the trench gate contacts in the termination area. In another exemplary embodiment, the step of forming the metal contact layer further comprises a step of forming an aluminum contact layer. In an exemplary embodiment, the method further includes a step of applying a trench mask first to form trench gates with gate runners extending from an active cell area to the terminal area provided for electrically connecting trench gates in the active cell area with the trench gates in the termination area not electrically connected to the trench gates in the active cell areas.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1A:
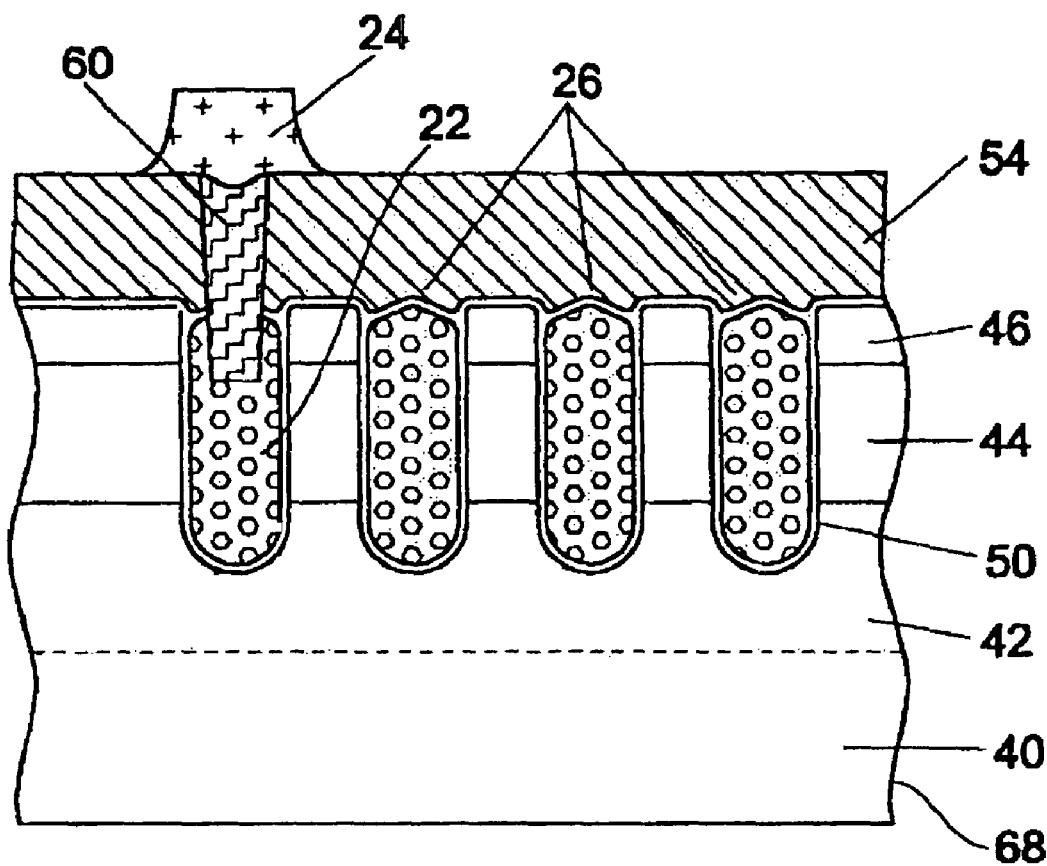
FIGS. 1A and 1B are two side cross sectional views of two conventional MOSFET devices for achieving saving body mask but having wide space between the active and the termination area.
Figure 1B:
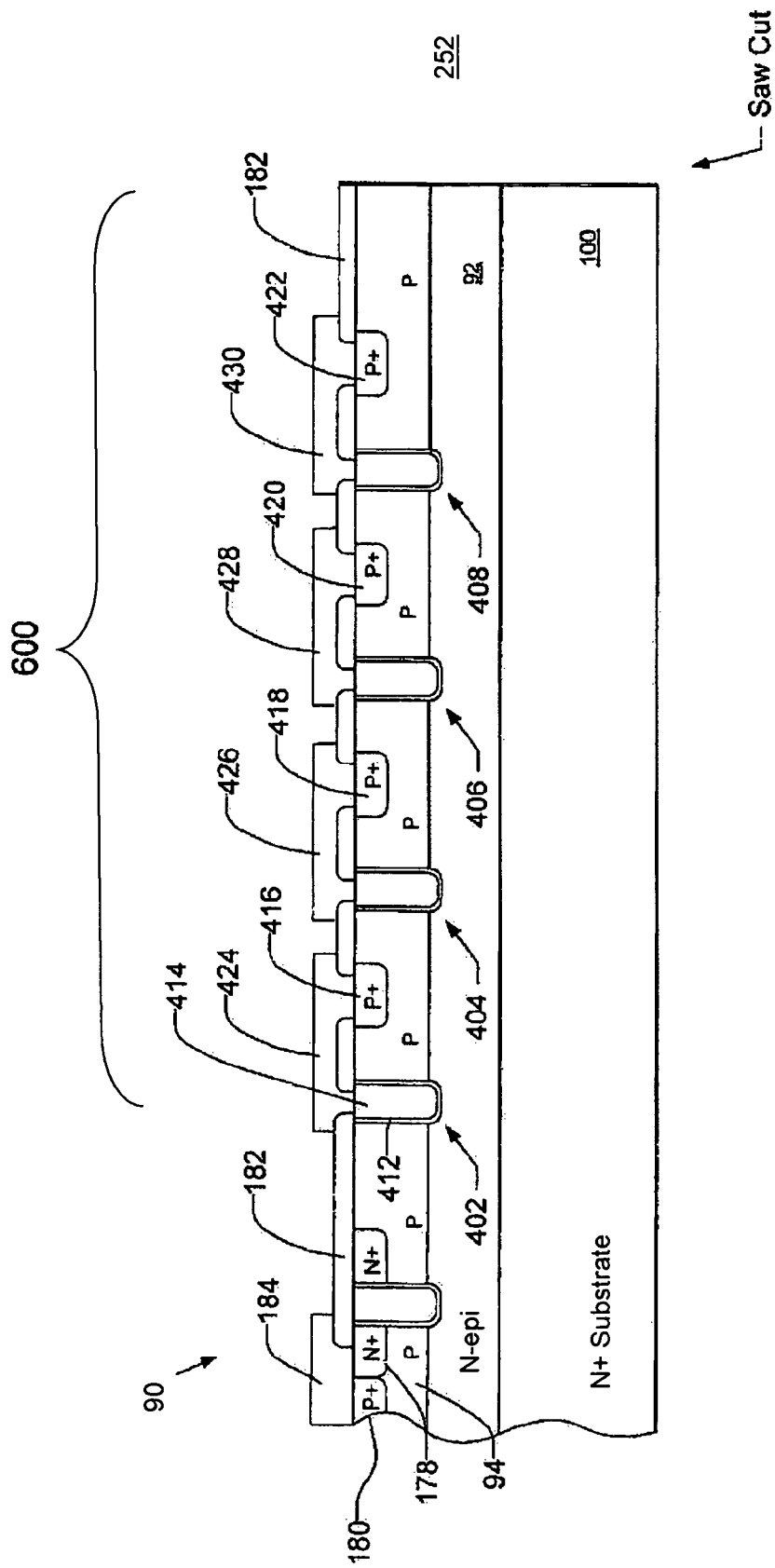
Figure 2A:
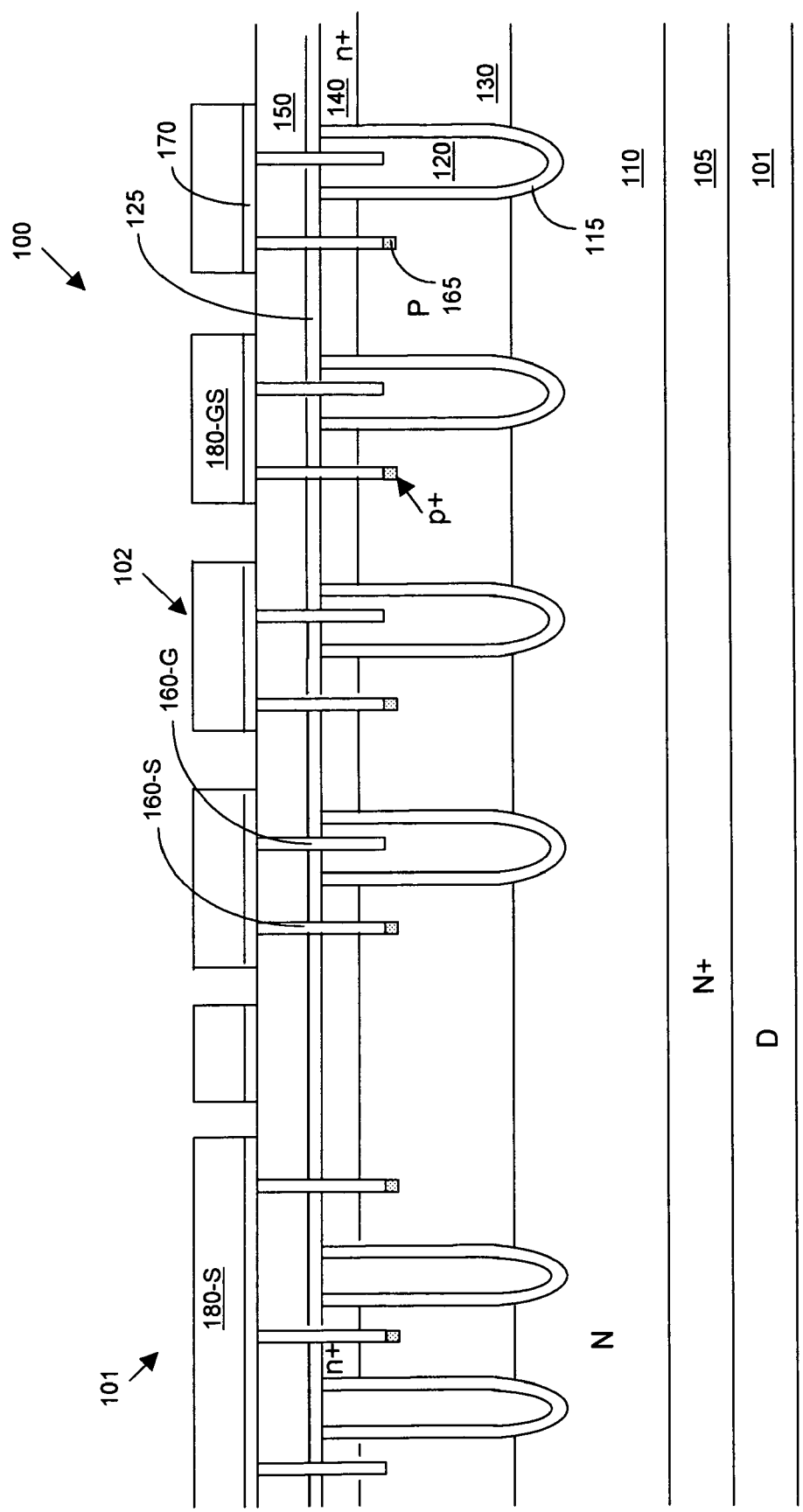
FIGS. 2A and 2B show respectively a side cross sectional view and a top view of an exemplary embodiment for a MOSFET with an improved configuration in the termination area for the present invention.
Figure 2B:
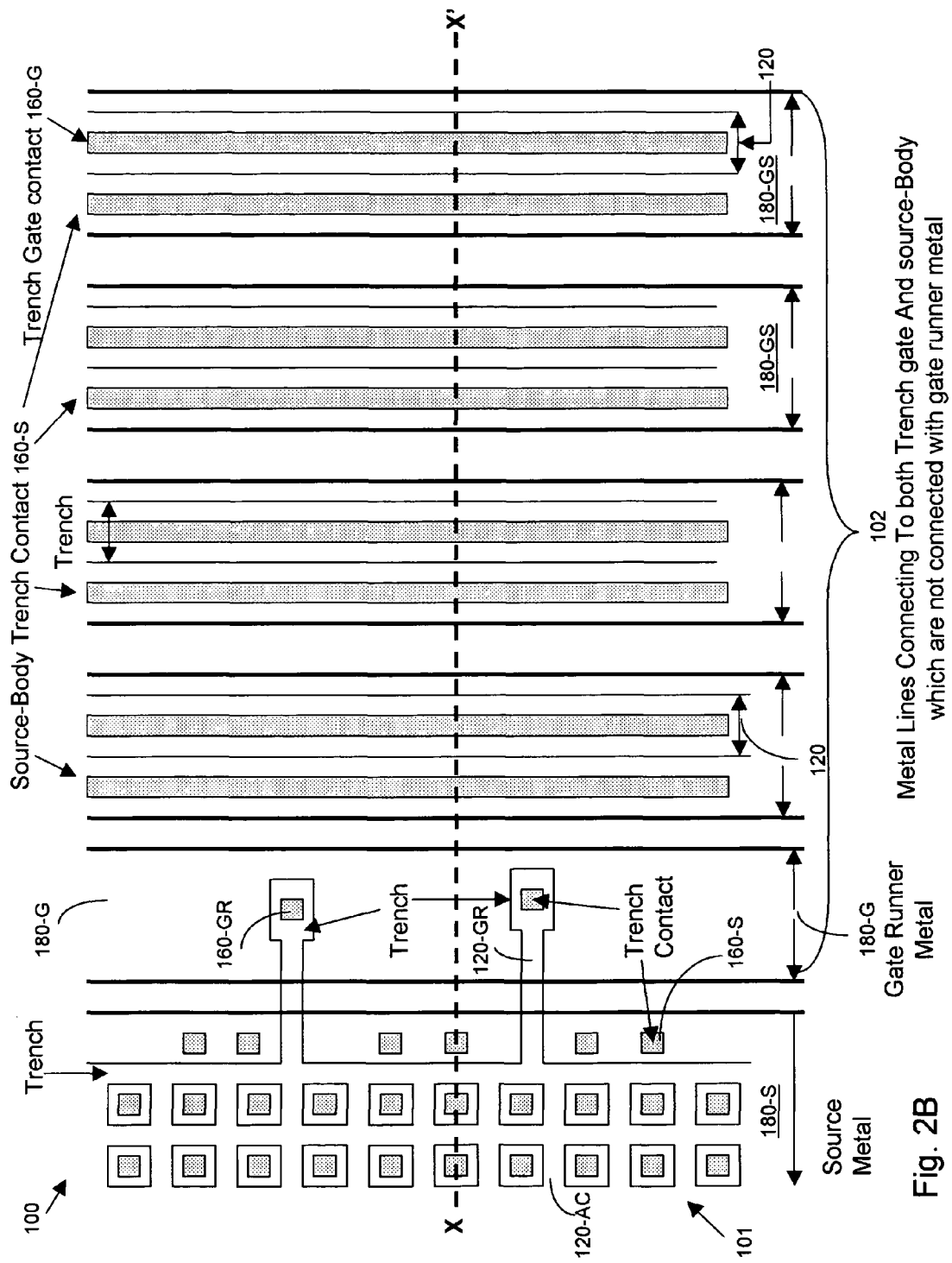

Please refer to FIGS. 2A and 2B respectively for a side cross sectional view and a top view of an exemplary embodiment of this invention where a metal oxide semiconductor field effect transistor (MOSFET) device 100 is supported on a substrate 105 formed with an epitaxial layer 110. A drain terminal 101 is disposed at the bottom of the substrate 105. The MOSFET device 100 includes a trenched gate 120 disposed in a trench with a gate insulation layer 115 formed over the walls of the trench. A body region 130 that is doped with a dopant of second conductivity type, e.g., P-type dopant, extends between the trenched gates 120. The P-body regions 130 encompassing a source region 140 doped with the dopant of first conductivity, e.g., N+ dopant. The source regions 140 are formed near the top surface of the epitaxial layer surrounding the trenched gates 120. The top surface of the semiconductor substrate extending over the top of the trenched gate, the P body regions 130 and the source regions 140 are covered with a NSG and a BPSG insulation layers 150. A contact enhancement layer 125 composed of Ti or Ti/TiN are formed on top of the insulation layer 150. For the purpose of improving the source contact to the source regions 140, a plurality of trenched source contact filled with a tungsten plug 160-S that is surrounded by a barrier layer Ti/TiN. The contact trenches are opened through the NSG and BPSG protective layers 150 to contact the source regions 140 and the P-body 130. Furthermore, there are trenched gate contact filled with tungsten plug 160-G surrounded by a barrier layer Ti/TiN with the gate contact trenches opened through the NSG and BPSG protective layers 150 and extended into the polysilicon 120 of the trenched gate 120.

A source metal layer 180S, a gate metal layer 180-GS are formed on top of the contact enhancement layer 125 wherein the source metal layer 180-S are in electrical contact with the source and body region through the source/body trench contact 160-S. Furthermore, the gate pads 180-GS are in electrical contact with the gates 120 through the trenched contact 160-G. Furthermore, the trench contact structure as shown in FIG. 2 further provide multiple trench gate contacted with source/body regions in the termination regions through the source/body trench contact 160-S that has a contact dopant regions 165 at the bottom of the source/body contact trenches 160-S.

FIG. 2B is a top view to illustrate that the MOSFET device is supported on a substrate divided into an active cell area 101 and a termination area 102. The trench gates 120-AC in the active cell (AC) area 101 extend to the termination area 102 as trench gate runner 120-GR for contacting through the trench contact 160-GR to the gate pad formed as gate runner metal 180-G in the termination area. The gate runners 160-GR and the gate runner metal 180-G are electrically separated and not in contact with the trench gates 120 in the termination area. The trench gates 120 in the termination area is electrically connected to the source/body regions through the trench gate contact 160-G and the source-body contact metal 180-GS in the termination area.

Figure 3A:
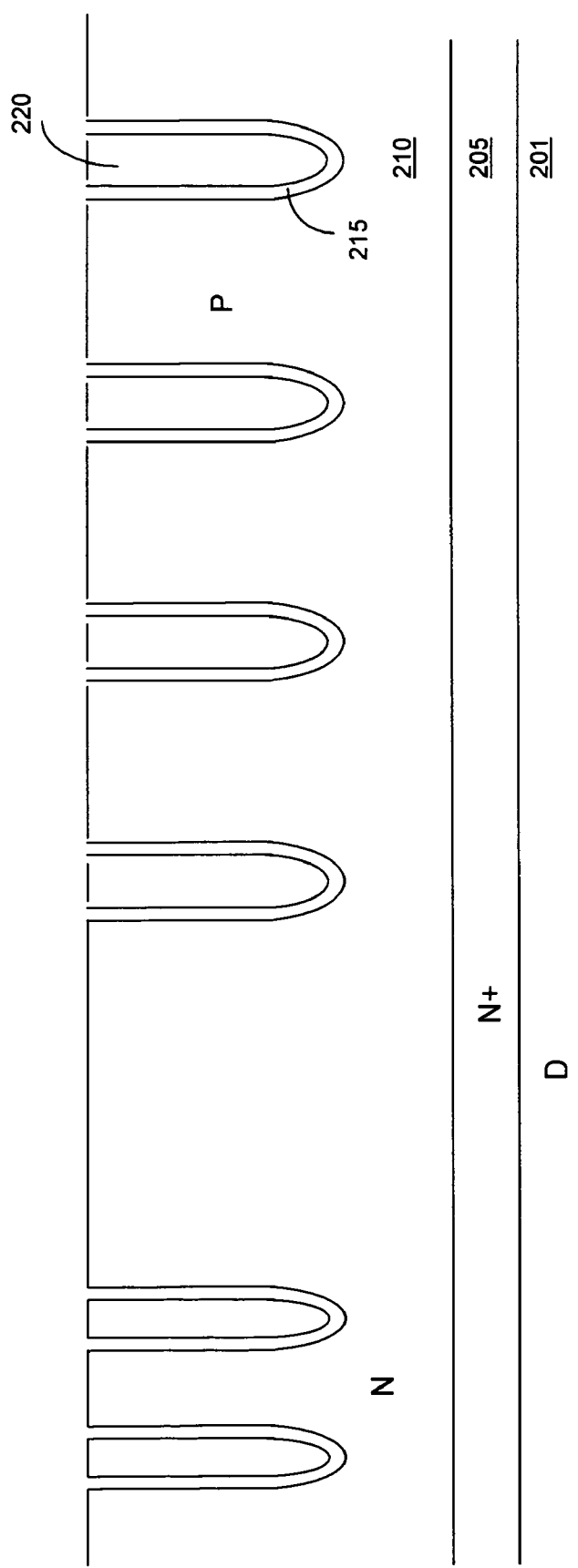
FIGS. 3A to 3D are a serial of side cross sectional views for showing the processing steps for fabricating a MOSFET device as shown in FIG. 2.

Referring to FIGS. 3A to 3D for a serial of side cross sectional views to illustrate the fabrication steps of a MOSFET device as that shown in FIG. 2. In FIG. 3A, a trench mask (not shown) is applied to open a plurality of trenches 220 in an epitaxial layer 210 supported on a substrate 205 by employing a dry silicon etch process. The substrate 205 functioning as a drain for the power device with a drain electrode 210 disposed at the bottom surface. A sacrificial oxide layer is then formed and removed to repair damaging surfaces due to the trench etching process. A gate oxide layer 215 is then formed followed by deposition of doped polysilicon layer 220 into the trenches to form the trenched gates padded by the gate oxide layer 215. A polysilicon etch back process or a chemical-mechanical planarization (CMP) process is carried out to remove the polysilicon layer from the top surface above the trench gate 220.

Figure 3B:
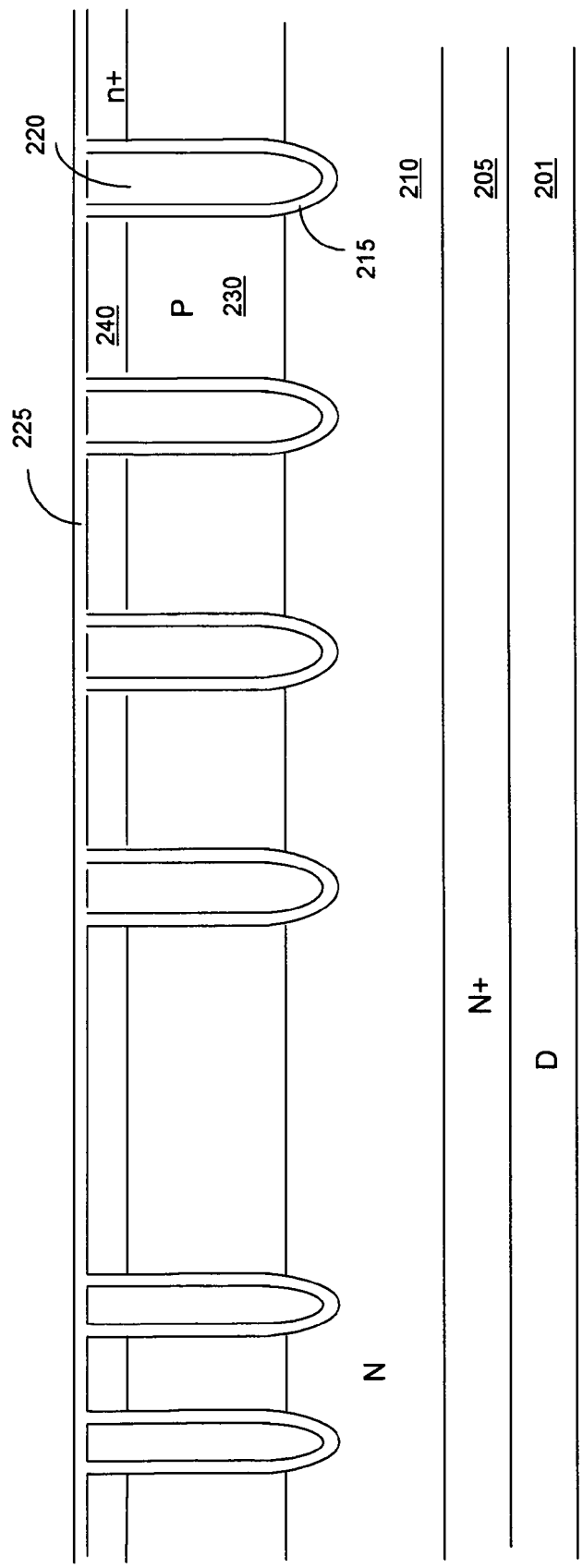
Figure 3C:
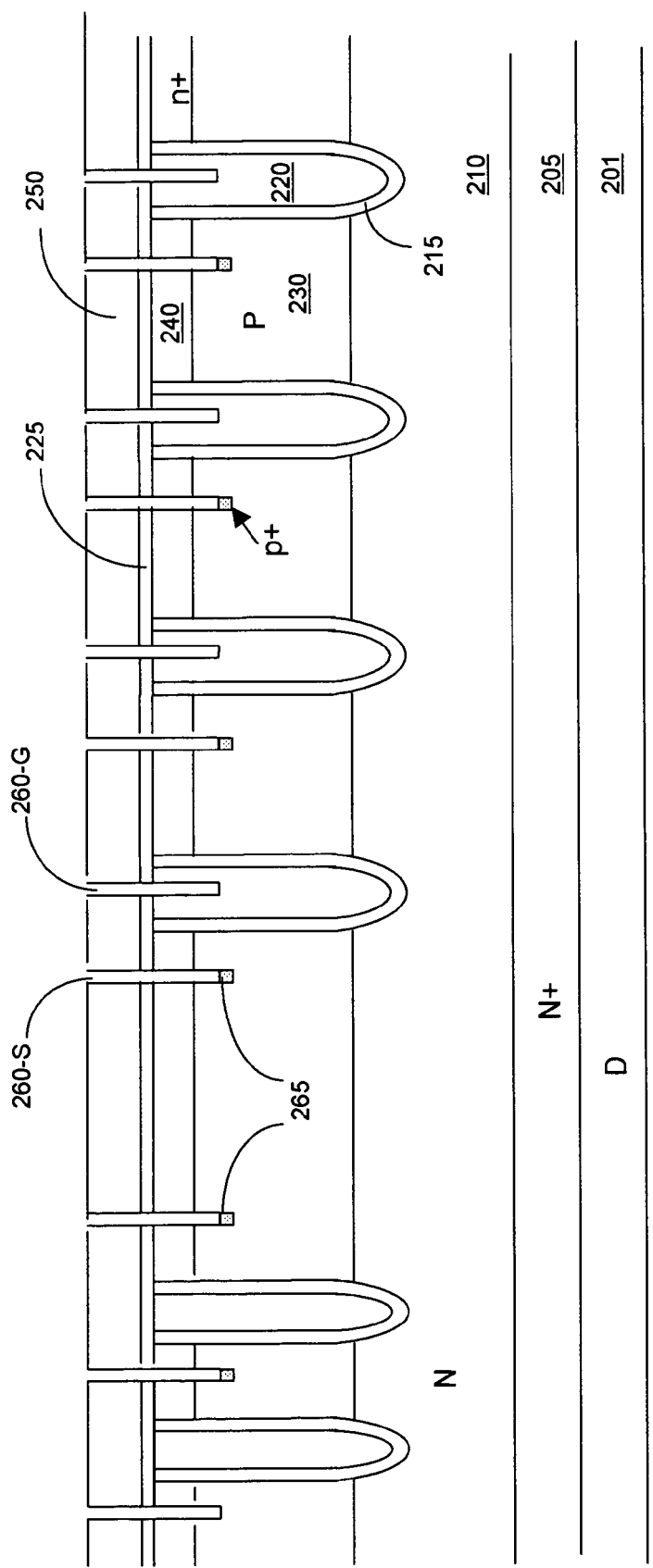
Figure 3D:
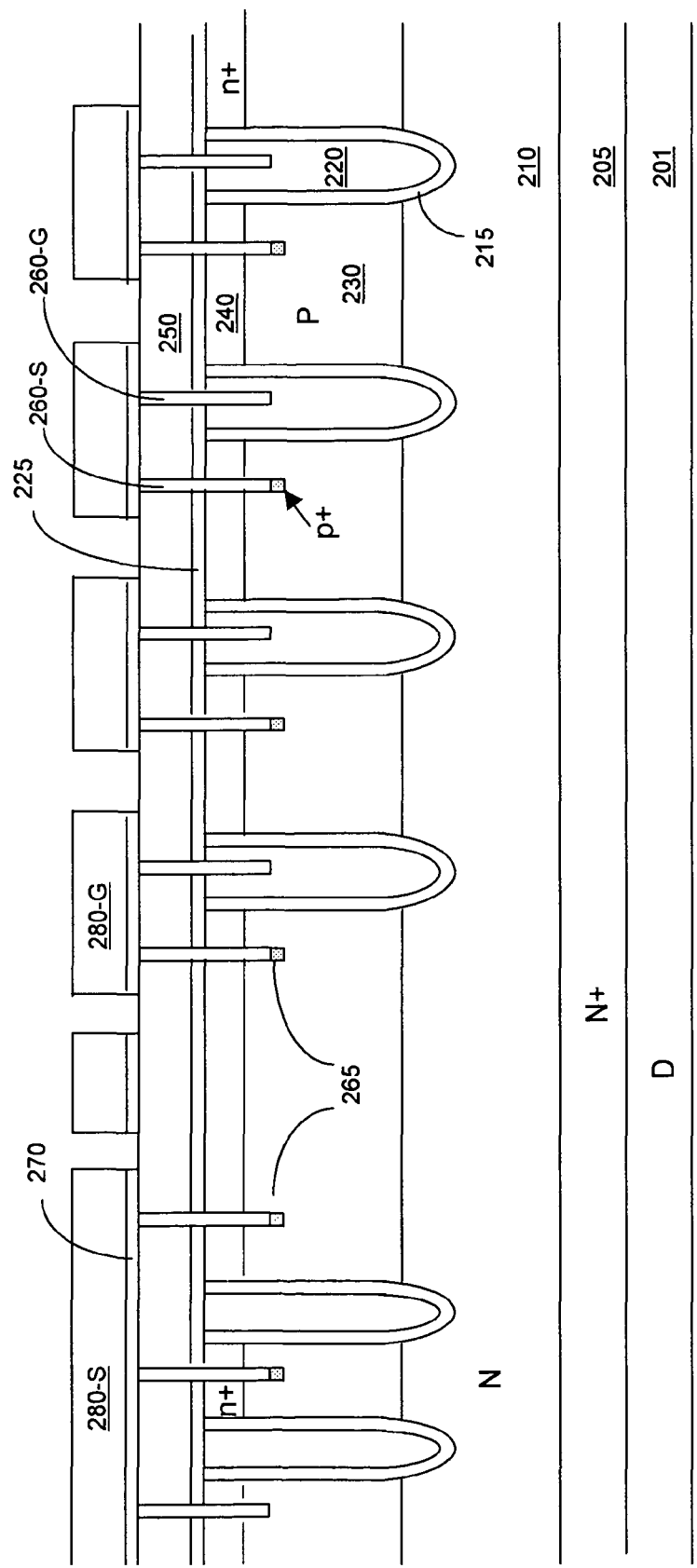

In FIG. 3B, a P-body ion implant is carried out and followed by a P-body diffusion to form the P-body 230 surrounding the gates 220. Then a source ion implant is carried out followed by a source diffusion to form the source regions 240 surround the trench gates 220 encompassed in the body regions 230. A thermal oxide layer 225 is formed covering the top surface of the substrate. In FIG. 3C, the manufacturing processes proceed with an oxide deposition to form an insulation layer 250 followed by applying a contact trench mask (not specifically shown) to carry out a dry oxide etch followed by a dry silicon etch to open a plurality of gate contact trenches 260-G and source/body contact trenches 260-S. Then, a BF2 ion implant is carried out to form the source/body contract regions 265 below the source/body contact trenches 260-S, followed by removing the contact trench mask. In FIG. 3D, a Ti/TiN deposition is performed to form a Ti/TiN berried layer in the contact trenches 260-G and 260-S followed by a rapid thermal anneal (RTA) process. A tungsten (W) deposition is carried out to fill the contact trenches 260-G and 260-S with tungsten contact plug followed by a Ti/TiN/W etch back to remove the contact plug from above the top surface of the contact trenches. A Ti or Ti/TiN deposition is performed to form a contact enhancement layer 270 followed by a alloy deposition to form a top metal layer. Then a metal mask (not specifically shown) is applied to pattern and etch the metal layer into gate pads 280-G and source metal 280-S with the gate pads electrically contacting both the gate 220 and source/body regions 230 and 240.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A semiconductor power device formed on a semiconductor substrate of a first conductivity type wherein the semiconductor power device includes trench gates surrounded by body regions of a second conductivity type encompassing source regions of the first conductivity type therein, said semiconductor power device further comprising:
   a trench contact structure having a plurality of trench contacts with trenches extended into the body regions for as source-body contacts and extended into the trench gates as gate contact;
   a termination area wherein a plurality of the trench gate contacts are electrically connected to the source-body contacts; and
   an active cell area and a plurality of gate runners as extension of the trench gates in the active cell areas extended to said termination area and the trench gates in the termination area are not electrically connected to the trench gates in the active cell area.

2. The semiconductor power device of claim 1 wherein:
   the semiconductor power device is a metal oxide semiconductor field effect transistor (MOSFET) device.

3. The semiconductor power device of claim 1 wherein:
   the semiconductor is a N-channel MOSFET device supported on a N-type semiconductor substrate.

4. The semiconductor power device of claim 1 wherein:
   the semiconductor power device is a P-channel MOSFET device supported on a P-type semiconductor substrate.

5. The semiconductor power device of claim 1 further comprising:
   a insulation layer covering a top surface of the semiconductor substrate with the plurality of trench contacts opened therethrough and each of the trench contacts is filled with a contact plug.

6. The semiconductor power device of claim 1 further comprising:
   an insulation layer covering a top surface of the semiconductor substrate with the plurality of trench contacts opened therethrough wherein each of the source-body trench contacts having a contact dopant region disposed below the source-body trench contacts.

7. The semiconductor power device of claim 1 wherein:
   the body regions and the source regions extended between areas between the trench gates whereby said body regions and source regions are formed without requiring a mask.

8. The semiconductor power device of claim 1 further comprising:
   a metal contact layer in electrical contact with said source-body contacts and also in electrical contact with the trench gate contacts for electrically connecting the trench source-body contacts to the trench gate contacts in the termination area.

9. The semiconductor power device of claim 8 wherein:
   the metal contact layer further comprises an aluminum layer.

10. A semiconductor power device formed on a semiconductor substrate of a first conductivity type wherein the semiconductor power device includes trench gates surrounded by body regions of a second conductivity type encompassing source regions of the first conductivity type therein, said semiconductor power device further comprising:
    a trench contact structure having a plurality of trench contacts with trenches extended into the body regions for as source-body contacts and extended into the trench gates as gate contact;
    a termination area wherein a plurality of the trench gate contacts are electrically connected to the source-body contacts; and
    the semiconductor power device further includes a insulation layer covering a top surface of the semiconductor substrate with the plurality of trench contacts opened therethrough and each of the trench contacts is filled with a contact plug composed of Ti/TiN as a barrier layer surrounding a tungsten plug.

* * * * *